United States Patent [19]
Glassburn

[11] Patent Number: 5,177,771
[45] Date of Patent: Jan. 5, 1993

[54] HIGH RESOLUTION SYMMETRICAL DIVIDER CIRCUIT

[76] Inventor: Tim R. Glassburn, 500 McCarthy Blvd., Milpitas, Calif. 95035

[21] Appl. No.: 804,232

[22] Filed: Dec. 5, 1991

[51] Int. Cl.⁵ .............................................. H03L 7/18
[52] U.S. Cl. ...................................... 377/39; 377/47; 377/48
[58] Field of Search ............................. 377/39, 47, 48

[56] References Cited

U.S. PATENT DOCUMENTS

| | | | |
|---|---|---|---|
| 4,704,723 | 11/1987 | Markland | 377/39 |
| 4,906,875 | 3/1990 | Cutler | 377/47 |
| 4,937,846 | 6/1990 | Malka et al. | 377/39 |

Primary Examiner—Andrew J. James
Assistant Examiner—Scott A. Ouellette
Attorney, Agent, or Firm—David B. Harrison

[57] ABSTRACT

A method divides a recurrent digital clocking signal into a quotient digital signal having a substantially symmetrical duty cycle within a range of programmable quotients, the quotients being selectable in single increments of the recurrent digital clocking signal within a range as selected by a divisor. The method includes the steps of loading the divisor from a source into a down counter clocked by the recurrent digital clocking signal; down counting from the divisor to zero with the down counter in synchronism with the recurrent digital clocking signal; setting a bistable latch to a first state of synchronism with a beginning of down counting from the divisor, the bistable latch for putting out the quotient digital signal; dividing the divisor by two to provide a half-count value; comparing the half-count value with a count reached by the down counter and generating a compare true signal upon detected equivalence of the half-count value and the count reached; and, setting the bistable latch to a second state opposite the first state in synchronism with the compare true signal. As one aspect of this invention the foregoing steps are continuously repeated every time the step of down counting reaches zero.

10 Claims, 5 Drawing Sheets

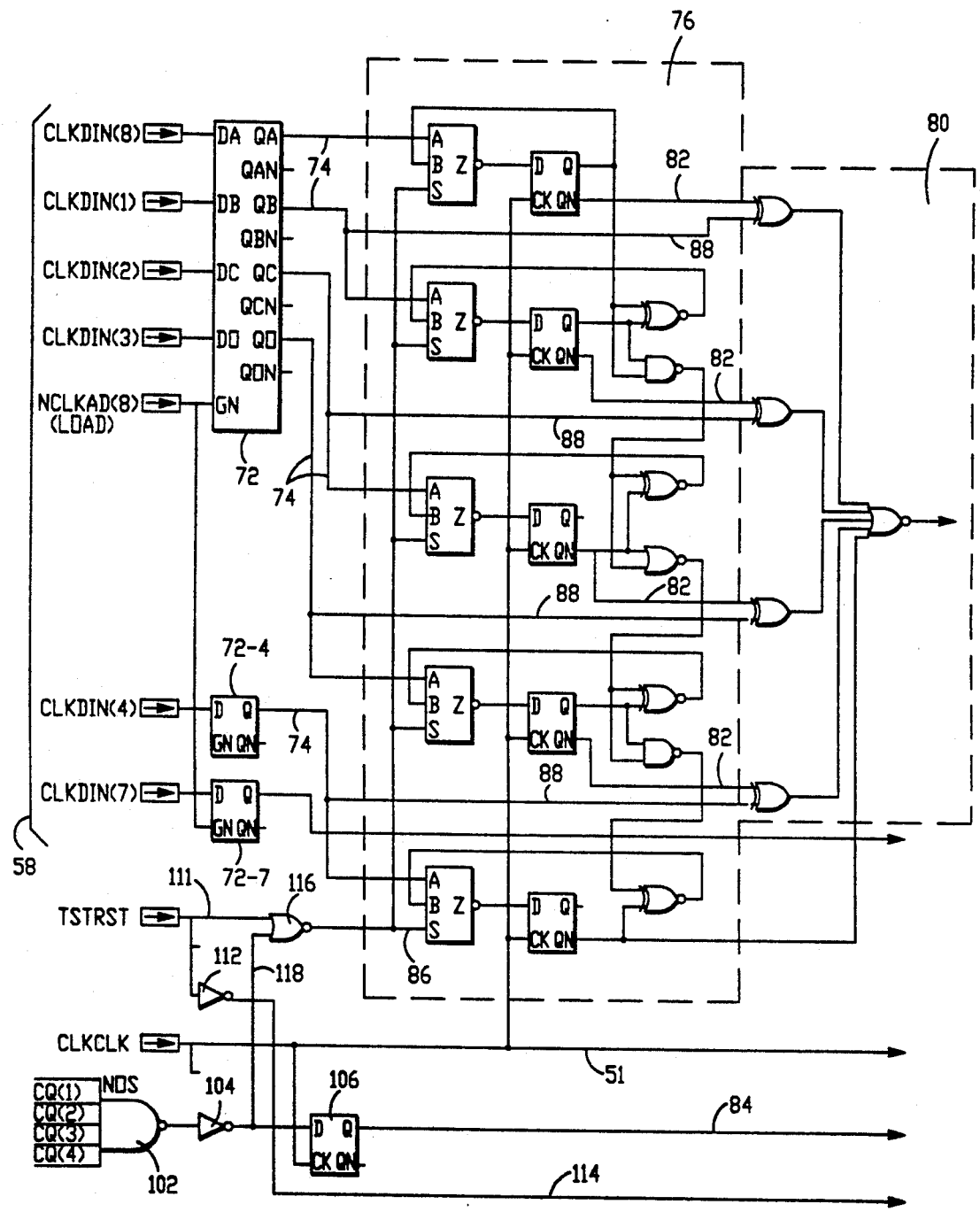
FIG.—4A

HIGH RESOLUTION SYMMETRICAL DIVIDER CIRCUIT

FIELD OF THE INVENTION

The present invention relates to a programmable frequency divider circuit. More particularly, the present invention relates to a programmable frequency divider circuit which puts out a programmed frequency having a substantially symmetrical duty cycle.

BACKGROUND OF THE INVENTION

Reference clocks for controlling precision equipment, such as the spindle speed of a rotating disk within a disk drive, require adjusting a clock reference with a maximum amount of resolution, while maintaining a high degree of symmetry between on and off portions of the clocking signal (hereinafter referred to as "symmetrical duty cycle").

A typical implementation of the prior art employs a standard counter and a toggle flip-flop which divides the output of the counter by two, in order to obtain a symmetrical output. The problem with this classical approach is that fine adjustment resolution is lost: i.e., the clock output period is adjustable in increments equal to twice the reference clock period, rather than in increments of the clock period, thereby necessitating a clock at a very high frequency and concomitantly greater complexity and expense associated with the operative circuitry.

SUMMARY OF THE INVENTION WITH OBJECTS

One object of the present invention is to provide a high resolution programmable frequency divider circuit which puts out a programmed frequency having a substantially symmetrical duty cycle which overcomes limitations and drawbacks of the prior art.

Another object of the present invention is to provide a programmable frequency divider which may be adjusted in increments of single reference clock periods and which also substantially maintains a symmetrical duty cycle throughout the programmable frequency range.

In accordance with one facet of the present invention, a method is provided for dividing a recurrent digital clocking signal count into a quotient digital signal having a substantially symmetrical duty cycle within a range of programmable quotients, the quotients being selectable in single increments of the recurrent digital clocking signal within a range as selected by a divisor. The method comprises the steps of:

loading the divisor from a source into a down counter clocked by the recurrent digital clocking signal, down counting from the divisor to zero with the down counter in synchronism with the recurrent digital clocking signal, setting a bistable latch to a first state in synchronism with beginning of down counting from the divisor, the latch for putting out the quotient digital signal, dividing the divisor by two to provide a half-count value, comparing the half-count value with a count reached by the down counter and generating a compare true signal upon detected equivalence of the half-count value and the count reached, and setting the latch to a second state opposite said first state in synchronism with the compare true signal.

In one aspect of this facet of the invention, the foregoing steps are repeated automatically when the step of down counting reaches zero.

In another aspect of this facet of the invention, the method comprises the further step of storing the divisor in a divisor register, and the step of loading the divisor from a source comprises the step of loading the divisor from the register.

In yet another aspect of this facet of the invention, the method comprises the further step of synchronously initializing the down counter and asynchronously clearing the bistable latch in response to a reset signal.

In a still further aspect of this facet of the invention, the method comprises the further step of selectively dividing the quotient digital signal put out from the latch by a predetermined factor in accordance with a logical state of a bit position of a digital value including the divisor.

As a further facet of the present invention, a divider circuit is provided for dividing a recurrent digital clocking signal count into a quotient digital signal having a substantially symmetrical duty cycle within a range of programmable quotients, the quotients being selectable in single increments of the recurrent digital clocking signal within a range as selected by a divisor. The divider circuit comprises a register for holding the divisor, a down counter for receiving the divisor from the register for down counting from the divisor to zero in synchronism with the recurrent digital clocking signal, a bistable latch set to a first logical state coincidently with beginning of the down counter to count down from the divisor (the latch for putting out the quotient digital signal), a divider for dividing the divisor by two to provide a half-count value, a digital comparator for comparing the half-count value with a count reached by the down counter and for generating a second state logical signal upon detected equivalence of the half-count value and the count reached, the latch being set by the second state logical signal to a second state opposite said first state unitl the first state logical signal occurs, whereupon operation of the circuit repeats.

As one aspect of this facet of the invention, the divider circuit further includes reset logic for synchronously initializing the down counter and asynchronously clearing the bistable latch in response to a reset signal.

As another aspect of this facet of the invention, the divider circuit further includes output divisor logic for selectively dividing the resultant output from the latch by a predetermined factor in accordance with a logical state of a bit position of a digital value including the divisor.

These and other objects, advantages, aspects and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIGS. 4A and 4B together provide a single and more detailed logic circuit diagram of a presently preferred implementation of the FIG. 2 divider circuit with FIG. 4A forming the left half of the diagram, and FIG. 4B forming the right half thereof.

DETAILED DESCRIPTION OF A PREFERRED EMBODIMENT

Figure 1:
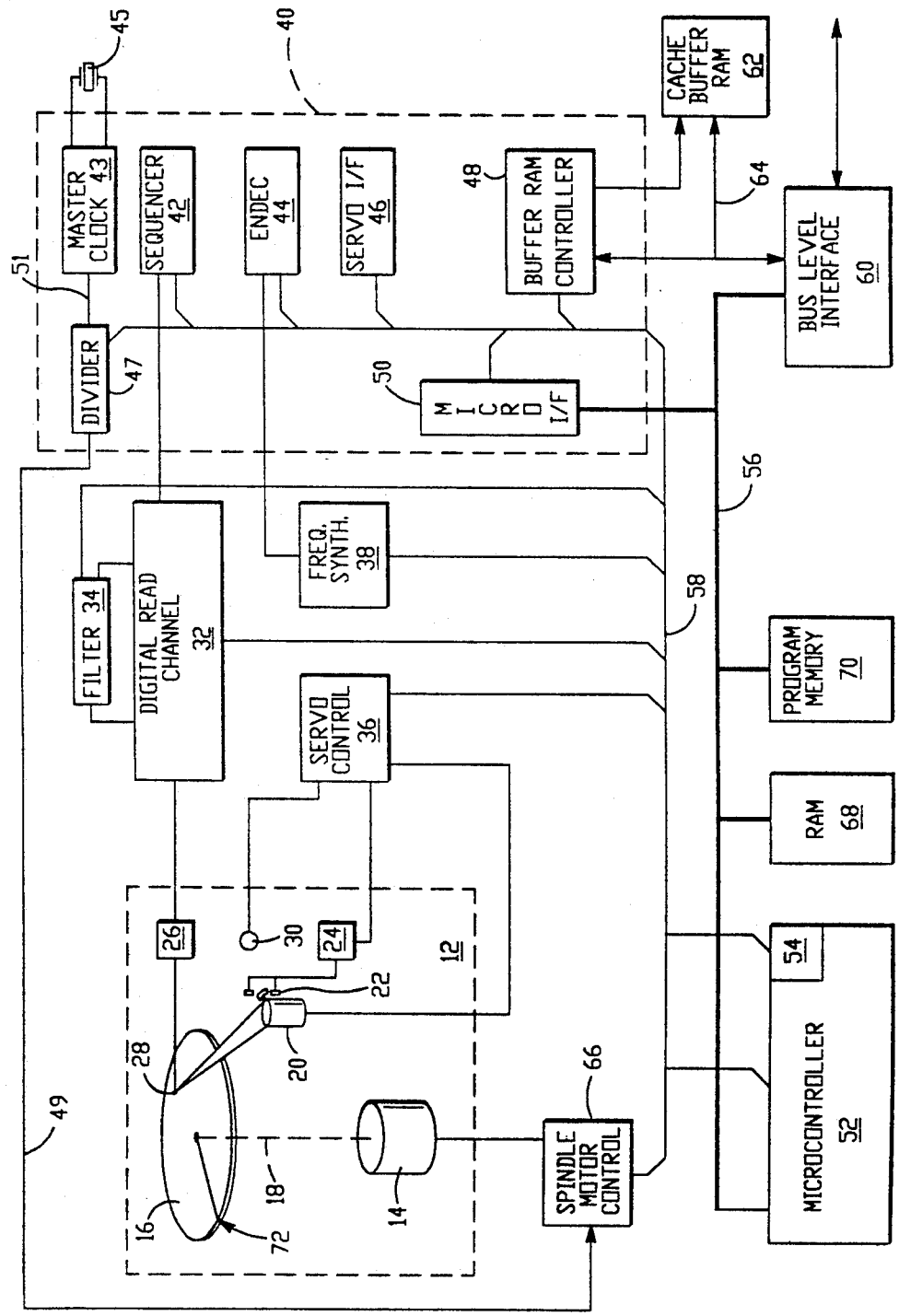
FIG. 1 is a simplified electrical block diagram of a disk drive data storage subsystem incorporating principles of the present invention.

Although the present invention may find advantageous applications in a wide variety of environments, it is particularly useful for controlling spindle motor speed within a fixed disk drive, such as the drive 10 illustrated in FIG. 1. With reference to FIG. 1, the disk drive 10 includes a head and disk assembly 12 including a poly-phase DC brushless spindle motor 14 and at least one data storage disk 16 mounted on a rotating spindle assembly 18 which is rotated at a programmable constant angular velocity by the spindle motor 14. A mass balanced rotary voice coil actuator assembly 20 includes e.g. a poly-phase optical encoder assembly 22 including a fixed light emitter/photodetector array and a moving microline scale rotated by the rotary voice coil actuator 20. An encoder circuit 24 provides driving signals for the light emitter and amplifies the minute signals induced in the photodetector array of the encoder assembly 22. A read preamplifier/head select/write driver circuit 26 is connected to a plurality of e.g. thin film heads 28 which are ganged vertically and positioned in unison by the rotary actuator 20. A temperature sensor 30 is also provided in the head and disk assembly 12 to sense temperature variations occurring therein.

A digital read channel 32 includes a programmable-gain controlled preamplifier having an input for receiving data from the preamplifier 26 and an output leading to a programmable electronic filter 34. An output from the filter 34 leads back into the read channel 32. The digital read channel includes a phase locked loop for synchronizing raw data from the disk 16 to an internal clock. In addition, the read channel 32 includes peak detectors for detecting burst peak amplitudes read by the head 28 when passing over the servo tracks.

A servo control circuit 36 provides circuitry supporting the optical encoder, and puts out two analog phase signals P1 and P2 which are converted to digital values with 11 bits of resolution to provide an angle servo following the locus of a circle in which eight adjacent track locations are defined by one traverse of the circle locus. Two digital comparison signals DIG-P1 and DIG-P2 are derived directly from the analog P1 and P2 signals and mark track boundary locations, thereby providing a count of tracks as the actuator is moved. The actuator driver circuitry is also present in the circuit 36. Pulse streams from two five-bit pulse width modulators are low pass filtered and then amplified to provide driving signals to a flat coil of the voice coil actuator 20. Opposite side segments of the coil are disposed in a gap having intense magnetic flux from oppositely facing permanent magnets, such that a current through the coil in one direction causes rotation in one direction, while reverse current causes rotation in the other direction. An electronic return spring is also included within the circuit 36 and when activated by power removal, rectifies and applies AC current from the spindle motor 14 acting as an alternator during spin down to the voice coil actuator 20 to move the heads 28 to a landing zone at an inner locus of the disk 16.

A frequency synthesizer 38 provides a master clock for an encoder/decoder 44, a microcontroller 52 and for an interface 60. A single crystal provides a reference frequency. Firmware executed by the microcontroller 52 enables the synthesizer 38 to generate and put out a plurality of different clocking rates to the encoder/decoder 44, so that zoned data recording rates are thereby supported among data track zones defined on the storage surfaces of the disk 16.

An application specific integrated circuit (ASIC) 40 includes a programmable data sequencer 42, the encoder/decoder 44, a system master clock 43 controlled by a crystal 45 oscillating at e.g. 40 megahertz, and providing a 40 MHz reference clock to a programmable divider circuit 47 over a path 51 in accordance with the principles of the present invention. The ASIC 40 also includes a servo interface 46, a buffer RAM controller 48 and a microcontroller interface 50.

By way of further background information, the sequencer 42 includes a control store writeable by the microcontroller so as to control the processing of serial data blocks and headers thereof read back from the disk surface 16 during data reading operations and written to the disk surface during data writing operations. Format operations, and on-the-fly error correction operations are also supported by the sequencer 42. The encoder/decoder 44 supports 1,7 RLL coding of the data stream and puts out three code bits for every two data bits in accordance with the usual convention relating to 1,7 RLL coding techniques. The servo interface comprises a series of pulse width modulators which receive and latch digital values from the microcontroller 52 and convert those values into pulse streams. One pulse width modulator controls adjustment of the optical encoder assembly 22. Two modulators together provide 10 bits of resolution for the actuator amplifier of the servo control circuit 36. Two other pulse width modulators control the characteristics of the programmable electronic filter 34. Yet another pulse width modulator controls the AGC amplifier within the digital read channel 32.

The buffer RAM controller 48 generates block addresses for controlling storage and retrieval of data blocks in a cache buffer RAM 62. The cache buffer RAM 62 is preferably comprised of dynamic RAM, and the controller 48 therefore generates row and column refresh signals RAS and CAS in a conventional fashion and applies these signals to refresh the dynamic storage cells of the RAM 62. A 256 kilobyte cache memory array is preferred for the cache buffer ram 62 and thereby enables four 64 kilobyte cache pages to be defined under firmware control of the microcontroller 52. A microcontroller interface 50 provides for bus-level connection to the microcontroller 52 via a shared address/data bus 56. The numerous other control lines extending throughout the drive 10 are collected in another bus 58 as shown in FIG. 1.

The interface 60 provides a bus-level interface with a host computing system (not shown) with which the disk drive subsystem 10 is used. Accordingly, the interface 60 may support an AT bus structure or a SCSI bus structure. In an AT interface implementation, the interface 60 typically includes a host interface for receiving data blocks and commands from the host, a series of command registers which are accessible by the microcontroller 52 via a microcontroller interface connected to the address/data bus 56, a FIFO for the data blocks and a cache buffer RAM interface leading to a data bus structure 64 extending between the interface 60, cache buffer RAM 62 and the buffer RAM controller 48. Data blocks are passed between the interface 60, cache buffer RAM and the encoder-decoder 44 via the bus 64 during data block transfers of the disk drive 10.

A spindle motor controller 66 is connected to control the spindle motor 14. The controller 66, preferably a type HA13481S made by Hitachi, Inc., or equivalent, receives an equal duty cycle frequency-programmable clock signal from the divider 47 over a signal path 49. The controller 66 is also connected to the auxiliary bus structure 58. The controller 66 receives phase commutation values from the motor 14 and passes motor speed monitoring and control signals to and from the microcontroller 52 via the bus 58. An index sensor circuit senses a once-per-revolution index mark and thereby provides an index interrupt signal to the microcontroller 52. A spindle clock signal from the integrated circuit 40 provides a reference to which the controller 66 synchronizes disk rotation.

An external random access memory 68 extends available temporary storage by e.g. 8 kilobytes beyond the capacity of internal RAM of the microcontroller 52, so that dynamic values can be stored and updated during operation of the drive 10. A 32 kilobyte external program memory 70 likewise extends the amount of program memory available to store the control firmware executed by the microcontroller 52. The memories 68 and 70 are connected to the shared address/data bus 56. Most preferably, the microcontroller 52 is implemented as an NEC type 78322, or equivalent, which is clocked at a basic clocking rate of 16 MHz. Time critical routines of the firmware, and time critical dynamic values are stored in the onboard storage locations of the microcontroller 52, while the balance of the firmware and values are stored in the external program memory 70 and RAM 68.

Further structural and functional details of a preferred embodiment of the disk drive 10 are found in a copending, commonly assigned U.S. patent application Ser. No. 07/762,683 filed on Sep. 19, 1991 and entitled "Low Profile, High Capacity Micro-Winchester Disk Drive" the disclosure of which is hereby incorporated herein by reference.

Figure 2:
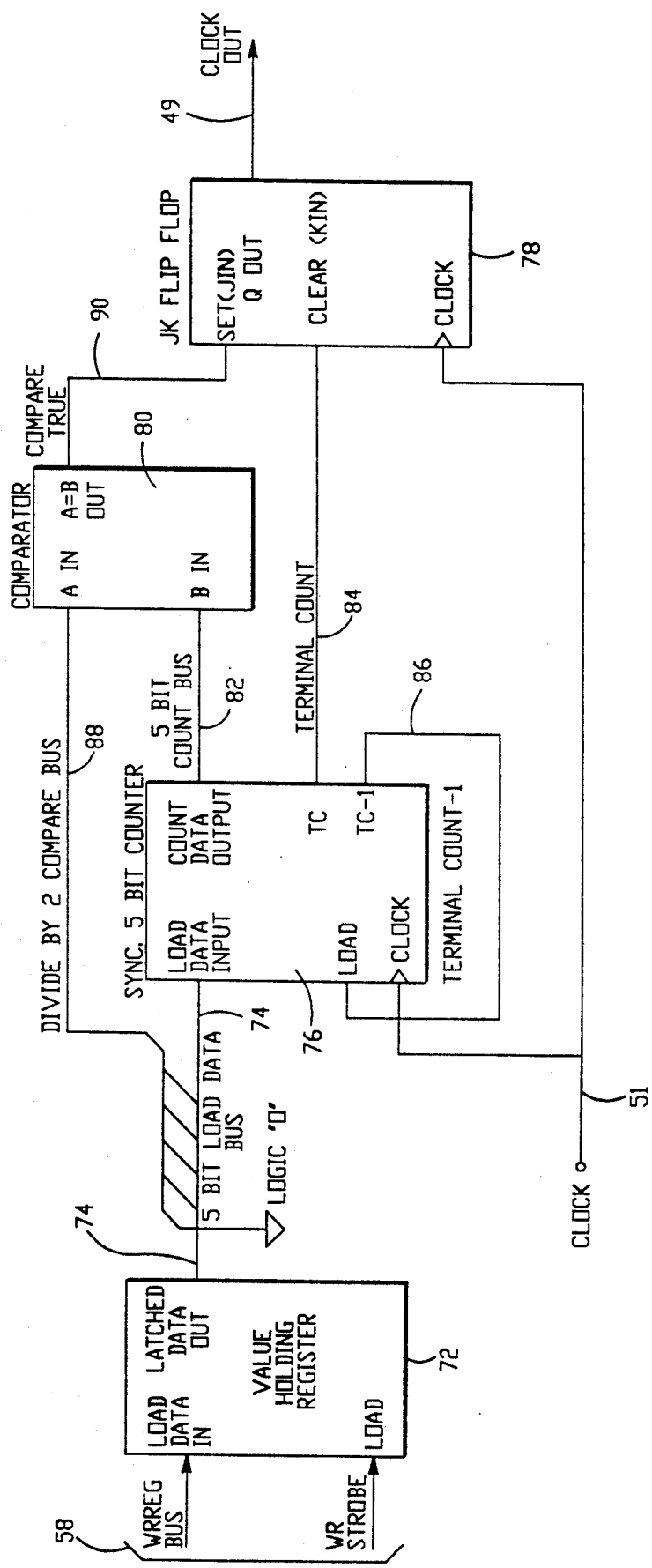
FIG. 2 is a simplified block diagram of a high resolution equal duty cycle programmable frequency divider in accordance with principles of the present invention.

With reference to FIG. 2, the divider circuit 47 includes a clock value holding register 72 which is connected to the bus 58 and is written by a value indicating a desired frequency output having an equalized duty cycle. The register 72 is written with a five bit word which sets the programmable period in terms of 25 nanosecond clock pulses. The duty cycle will be as close to 50% as possible (exactly 50% for even integer five bit values, and approximately 50% for odd integer five bit program values). For example, a program value of 31 (which is the maximum value available) will cause the output of the divider circuit 47 to be low for 16 40 MHz clock periods. The smallest valid value that may be programmed into the register 72 is a 2, which sets a 20 MHz output (i.e. 40 MHz divided by two). By setting the most significant bit of the eight bit register 72, an additional divide-by-8 of the programmed output frequency will be performed.

The divider circuit 47 also includes a synchronous five bit counter 76, a JK flip-flop 78 and a five bit comparator 80, configured as shown in FIG. 2. The five bit counter 76 includes a five bit count bus 82, a terminal count line 84 and a terminal count minus one line 86. The five bit count bus 82 feeds into a B input of the comparator 80, whereas the terminal count line 84 is connected to a synchronous clear input of the JK flip-flop 78. The terminal count minus one line 86 is fed back to a load input of the five bit counter 76. A divide by two compare bus 88 is formed by connecting to the five bit load data bus 74 in a manner effectuating a logical right shift operation in accordance with well known binary arithmetic procedures. For example, bit 0 of the load data bus 74 is not connected, bit 1 of the load bus 74 becomes bit 0 of the compare bus 88, bit 2 of the load bus 74 becomes bit 1 of the compare bus 88, and so forth. Bit 4 of the compare bus is held at a logical low level, thereby preloading that bit position with a zero.

The divide by two compare bus 88 is connected to an A input of the comparator 80. A compare true output signal line 90 from the comparator is connected to a synchronous set input of the JK flip-flop. The synchronous five bit counter 76 and the JK flip-flop 78 are synchronously clocked by the 40 MHz square wave clock signal on the line 51 from the crystal controlled master clock 43.

Figure 3:
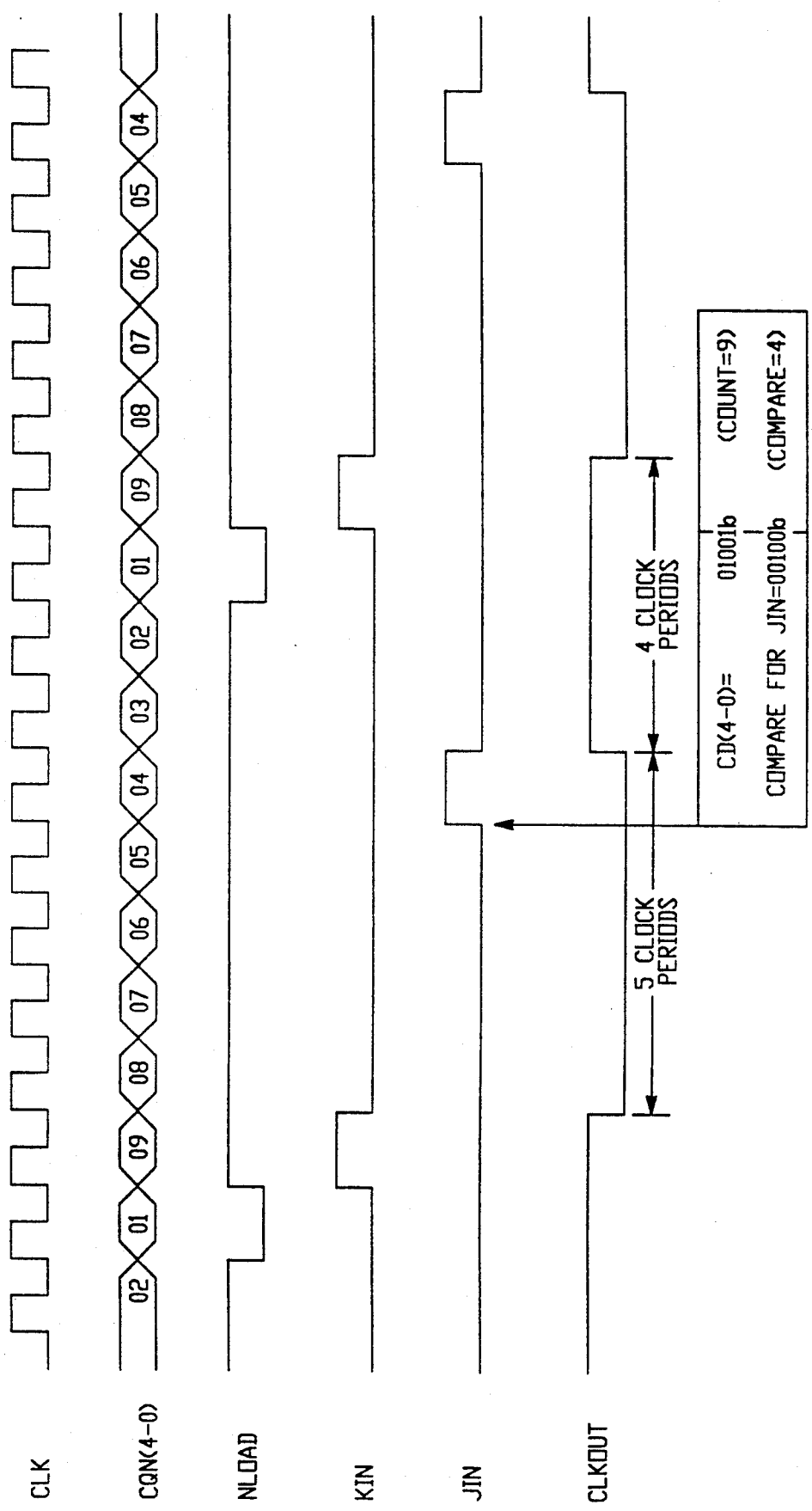
FIG. 3 is a timing diagram illustrating a programming example for operating the FIG. 2 programmable frequency divider.

Operation of the programmable divider circuit will now be explained with reference to a programming example given in FIG. 3. In the FIG. 3 example, a 40 MHz clock train is shown in graph CLK. A load value of 9 clock periods (11 Hex) is loaded into the value holding register 72. The synchronous five bit counter 76 receives a count set value of nine (01001 binary) via the load data bus 74. At the same time, the divide by two compare bus 88 shifts the count set value to the right by one bit position without remainder and thus presents a value of four (00100) to the reference input A of the comparator 80.

When the counter 76 reaches a count of one, the terminal count of one signal on the line 86 causes the counter synchronously to load the value (e.g. nine) appearing on the load data bus 74. At the rising edge of the NLOAD pulse which occurs as a result of the feedback path 86, the terminal count line 84 becomes true and synchronously clears the K input of the JK flip-flop 78, which causes the output clock signal CLKOUT on the path 49 to assume a logical low condition which continues for five clock periods.

When the synchronous five bit counter 76 reaches a count of 4 (the value presented to the A input of the comparator 80 via the divide by two compare bus 88), a compare true pulse (JIN) is generated and supplied to the J input of the JK flip-flop 78. On the rising edge of the next clock pulse, the output clock signal CLKOUT becomes true, and remains true for four clock periods. After the end of the four clock periods, on the falling edge of the KIN signal, the JK flip-flop is synchronously cleared, and the output clock signal CLKOUT returns to a logical low condition for the next five clock periods.

In the foregoing example in which the program value stored into the value holding register 72 is 9, the duty cycle between on and off of each output cycle of the output clock signal CLKOUT is not exactly symmetrical, i.e. off for five clocks and on for four clocks. However, this slight discrepancy in the duty cycle does not interfere with controlling operation of the spindle motor control circuit 66, and hence with speed vernier control of the spindle motor 14. If the preset value were 10 (or any value within the programming range evenly divisible by two), instead of nine, the output clock signal CLKOUT will be perfectly symmetrical, i.e. on for five clocks and off for five clocks.

Figure 4B:
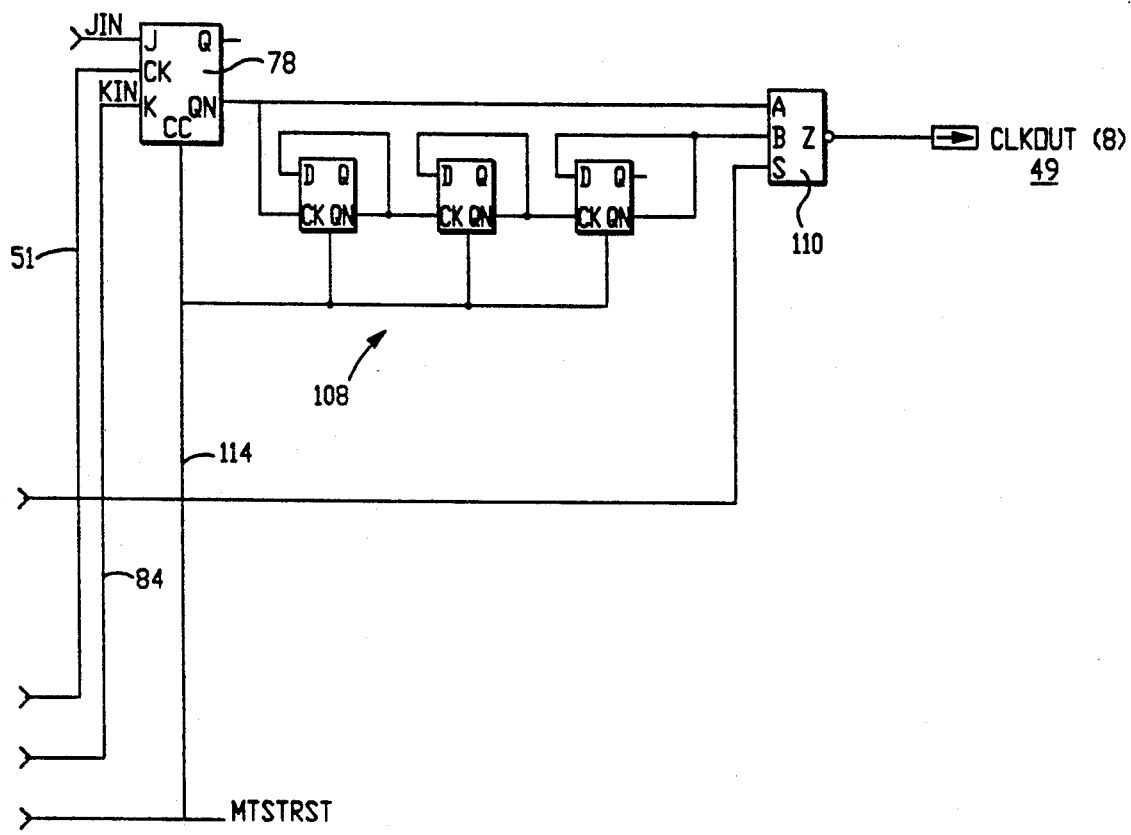

FIGS. 4A and 4B provide a more detailed diagram of the divider circuit 47. In this more detailed diagram, the terminal count signal put out on the line 84 from the counter 76 is shown as being generated by a five input NAND gate 102, an inverter 104 and a D flip-flop 106. The value holding register 72 is implemented with a quad latch for the first four bit positions (0-3), and with two single-bit latches for bit positions five and eight (4 and 7). The latch for the most significant bit (bit 7) leads to and enables a multiplexer 110 which selects between a divide by eight counter 108 formed as a tandem array of D flip-flops and the JK flip-flop 78.

A test/reset signal line 111 leads through an inverter 112 to provide a reset signal over a signal line 114 to reset the JK flip-flop 78 and the divide by eight counter array 108. The test/reset signal on the line 111 initializes the counter 108 by forcing a synchronous load. If the value holding register 72 is loaded with zeros, the counter 108 is thereby reset to a zero initial state. The test/reset signal line 111 also enters a NOR gate 116. Another input line 118 extends from the output of the inverter 104 to the NOR gate 116. Thus, either the test/reset signal will cause the synchronous five bit counter array 76 to load, or one count occurring before the output of the D flip-flop 106 will cause the counter array 76 to load the program count held in the latch 72.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A method for dividing a recurrent digital clocking signal into a quotient digital signal having a substantially symmetrical duty cycle within a range of programmable quotients, the quotients being selectable in single increments of the recurrent digital clocking signal within a range as selected by a divisor, comprising the steps of:
   loading the divisor from a source into a down counting means clocked by the recurrent digital clocking signal,
   down counting from the divisor to zero with the down counting means in synchronism with the recurrent digital clocking signal,
   setting a bistable latch means to a first state in synchronism with a beginning of down counting from the divisor, the latch means for putting out the quotient digital signal,
   dividing the divisor by two to provide a half-count value,
   comparing the half-count value with a count reached by the down counting means and generating a compare true signal upon detected equivalence of the half-count value and the count reached,
   setting the bistable latch means to a second state opposite said first state in synchronism with said compare true signal.

2. The method set forth in claim 1 comprising a step of repeating the steps thereof automatically when the step of down cunting reaches zero.

3. The method set forth in claim 1 comprising a further step of storing the divisor in a register means and wherein the step of loading the divisor from a source comprises the step of loading the divisor from the register means.

4. The method set forth in claim 1 comprising a further step of synchronously initializing the down counting means and asynchronously clearing the bistable latch means in response to a reset signal.

5. The method set forth in claim 1 comprising a further step of selectively dividing the quotient digital signal from the bistable latch means by a predetermined factor in accordance with a logical state of a bit position of a digital value including the divisor.

6. A divider circuit for dividing a recurrent digital clocking signal into a quotient digital signal having a substantially symmetrical duty cycle within a range of programmable quotients, the quotients being selectable in single increments of the recurrent digital clocking signal within a range as selected by a divisor, comprising:
   register means for holding the divisor,
   down counting means for receiving the divisor from the register means for down counting from the divisor to zero in synchronism with the recurrent digital clocking signal,
   bistable latch means set to a first state by a first state logical signal occurring coincidently with a beginning of the down counting means to count down from the divisor, the latch means for putting out the quotient digital signal,
   divide-by-two divider means for dividing the divisor by two to provide a half-count value,
   comparator means for comparing the half-count value with a count reached by the down counting means and for generating a second state logical signal upon detected equivalence of the half-count value and the count reached,
   the bistable latch means being set by the second state logical signal to a second state opposite said first state, until the first state logical signal occurs, whereupon operation of the circuit repeats.

7. The divider circuit set forth in claim 6 further comprising reset means for synchronously clearing the down counting means and the latch means in response to a reset signal.

8. The divider circuit set forth in claim 6 further comprising output divisor means for selectively dividing the resultant output from the bistable latch means by a predetermined factor in accordance with a logical state of a bit position of a digital value including the divisor.

9. The divider circuit set forth in claim 6 wherein the bistable latch means comprises a JK flip-flop.

10. The divider circuit set forth in claim 6 wherein the register means comprises a plurality of bit positions including a least significant bit position, a most significant bit position, and a plurality of bit positions between the least significant bit position and the most significant bit position, and wherein the divide-by-two divider means is realized by connecting a divide-by-two bus means to bit positions of the register means beginning one bit position above the least significant bit position of the register means.

* * * * *